United States Patent
Sousa et al.

(10) Patent No.: US 10,834,306 B2
(45) Date of Patent: Nov. 10, 2020

(54) METHOD FOR A REMOTE CONTROL OF A RADIATION DETECTION APPARATUS

(71) Applicant: International Business Machines Corporation, Armonk, NY (US)

(72) Inventors: Marilyne Sousa, Adliswil (CH); Heinz Siegwart, Zurich (CH); Henry Wrieth, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/247,676

(22) Filed: Jan. 15, 2019

(65) Prior Publication Data
US 2020/0228699 A1 Jul. 16, 2020

(51) Int. Cl.
| | |
|---|---|
| A61B 6/00 | (2006.01) |
| H04N 7/15 | (2006.01) |
| H04N 19/70 | (2014.01) |
| H04N 19/40 | (2014.01) |
| H04N 19/176 | (2014.01) |
| H04L 29/06 | (2006.01) |

(Continued)

(52) U.S. Cl.
CPC ....... *H04N 5/23206* (2013.01); *H04L 67/141* (2013.01); *H04L 69/16* (2013.01); *H01J 37/22* (2013.01); *H01J 37/26* (2013.01); *H04L 67/42* (2013.01)

(58) Field of Classification Search
CPC ... H04N 5/23206; H04L 67/141; H04L 69/16; H04L 67/42; H01J 37/22; H01J 37/26
USPC .......................................................... 348/80
See application file for complete search history.

(56) References Cited

U.S. PATENT DOCUMENTS

| | | | |
|---|---|---|---|
| 6,440,072 B1 * | 8/2002 | Schuman | A61B 5/0017 600/437 |
| 8,108,577 B1 | 1/2012 | Hobbs | |

(Continued)

FOREIGN PATENT DOCUMENTS

| | | |
|---|---|---|
| JP | 2004234992 A | 8/2004 |
| JP | 2009124709 A | 6/2009 |

OTHER PUBLICATIONS

Voelkl, E., et al., "Remote Operation of Electron Microscopes", Scanning, Accepted with revision Sep. 25, 1996, pp. 286-291, vol. 19.

*Primary Examiner* — Zaihan Jiang
(74) *Attorney, Agent, or Firm* — Scully, Scott, Murphy & Presser, P.C.; Daniel P. Morris

(57) ABSTRACT

The present disclosure relates to a method for a remote control of a radiation detection apparatus. The method comprises providing a remote system comprising a remote computer system and a hardware controller. The remote computer system is configured to operate in a client-server configuration with a local computer system, wherein the local computer system is a server locally connected to the detection apparatus. Output data of an imaging system of the detection apparatus may be received from the local computer system over a first network connection established between the local computer system and the remote computer system. A second network connection may be established between the hardware controller and the imaging system. And, the imaging system may be controlled by sending via the second network connection control signals to the imaging system. The second network connection is logically independent from the first network connection.

17 Claims, 3 Drawing Sheets

(51) Int. Cl.
*H04N 5/232* (2006.01)
*H04L 29/08* (2006.01)
*H01J 37/22* (2006.01)
*H01J 37/26* (2006.01)

(56) References Cited

U.S. PATENT DOCUMENTS

| | | | |
|---|---|---|---|
| 9,104,271 B1* | 8/2015 | Adams | G06F 3/0426 |
| 9,402,601 B1* | 8/2016 | Berger | A61B 8/4472 |
| 2010/0169423 A1* | 7/2010 | Eguchi | A61B 6/4233 |
| | | | 709/204 |
| 2013/0185331 A1* | 7/2013 | Conemac | G06F 16/27 |
| | | | 707/783 |
| 2015/0078522 A1* | 3/2015 | Makino | A61B 6/4405 |
| | | | 378/62 |
| 2015/0081579 A1* | 3/2015 | Brown | H04W 4/90 |
| | | | 705/325 |
| 2015/0089337 A1* | 3/2015 | Grady | A61B 6/468 |
| | | | 715/202 |
| 2015/0208037 A1* | 7/2015 | Maurice | H04L 65/4046 |
| | | | 348/14.09 |
| 2015/0367145 A1* | 12/2015 | Sjolund | A61N 5/1038 |
| | | | 600/1 |
| 2016/0283660 A1* | 9/2016 | Ohashi | G06F 19/321 |
| 2017/0346905 A1 | 11/2017 | Pognant | |
| 2017/0367685 A1* | 12/2017 | Zou | G06T 7/74 |
| 2018/0054575 A1* | 2/2018 | Pawlowicz | H01J 37/28 |

* cited by examiner

METHOD FOR A REMOTE CONTROL OF A RADIATION DETECTION APPARATUS

BACKGROUND

The present disclosure relates to the field of digital computer systems, and more specifically, to a method for a remote control of a radiation detection apparatus.

Imaging systems such as Transmission Electron Microscopes (TEM) or Scanning Transmission Electron Microscopes (STEM) use a high voltage electron beam to illuminate a specimen and create an image. The electron beam is produced by a cold-cathode field-emission electron gun. In combination with spherical aberration correctors, high resolution imaging and chemical analyses can be achieved. The resulting images can be used for analyzing materials at the atomic and molecular levels. However, the operation of such imaging systems leads to overly long latency times, which prevent satisfactory user feedback when operated overseas.

SUMMARY

Various embodiments provide a method for a remote control of a radiation detection apparatus, control system and radiation detection system as described by the subject matter of the independent claims. Advantageous embodiments are described in the dependent claims. Embodiments of the present invention can be freely combined with each other if they are not mutually exclusive.

In one aspect, the invention relates to a method for remotely controlling a radiation detection apparatus comprising an imaging system, wherein the detection apparatus is locally connected to a local computer system and is remotely controllable by a hardware controller. The method comprises:

providing a remote control system comprising a remote computer system and the hardware controller;
configuring the remote computer system for it to operate in a client-server configuration with the local computer system, wherein the latter is configured as a server; and
receiving from the local computer system output data of the imaging system over a first network connection established between the local computer system and the remote computer system in said client-server configuration, and controlling the detection apparatus by sending control signals to the detection apparatus via a second network connection established between the hardware controller and the detection apparatus, the second network connection being logically independent from the first network connection established.

In another aspect, the invention relates to a control system comprising a hardware controller for remotely controlling a radiation detection apparatus locally connected to a local computer system, the detection apparatus including an imaging system, wherein the control system is configured to:

operate in a client-server configuration with the local computer system, the latter configured as a server;
receive from the local computer system output data of the imaging system over a first network connection established between the local computer system and the control system in said client-server configuration, in operation; and
control the detection apparatus by sending control signals thereto, via a second network connection established between the hardware controller and the detection apparatus, in operation, the second network connection being logically independent from the first network connection established.

In another aspect, the invention relates to a radiation detection system for controlling a radiation detection apparatus comprising an imaging system, wherein the radiation detection system comprises a local computer system locally connected to the detection apparatus. The radiation detection system configured to:

operate in a client-server configuration with a remote control system comprising a remote computer system and a hardware controller, the local computer system configured as a server;
establish a first network connection between the local computer system and the remote computer system in said client-server configuration, and a second network connection between the hardware controller and the detection apparatus, wherein the second network connection is logically independent from the first network connection, in operation, so as for the remote control system to receive from the local computer system output data of the imaging system over the first network connection, and control the detection apparatus by sending control signals to the detection apparatus via the second network connection, in operation.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

Figure 1:
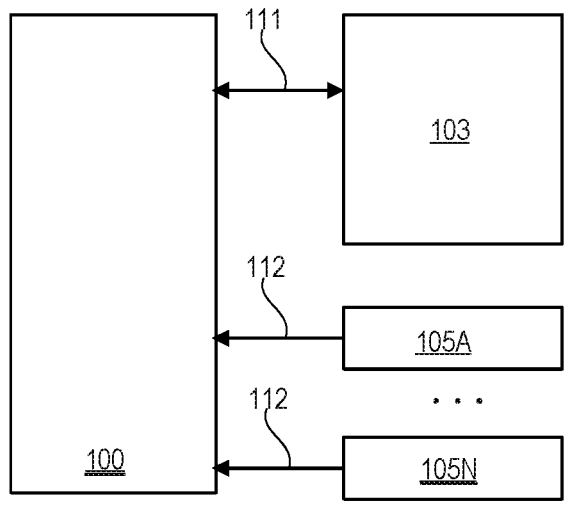
FIG. 1 depicts a diagram of a radiation detection apparatus in one embodiment.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present method and system may enable a fast data transfer, which allows a live remote operation of imaging systems such as Transmission Electron Microscopes (TEM).

The first and second network connections may logically be independent. For example, the first and second network connections may be logically independent as the first and second network connections may be operated independently from each other, although they may be tunneled over a same IP infrastructure, for example. Yet, data are independently exchanged over the two connections. Alternatively or additionally, the first and second network connections may be two physically distinct connections. For example, each of the first and second network connections may have a respective physical source port and/or physical interface.

According to one embodiment, the transfer of data over the first network connection is performed using a first communication protocol distinct from a second communication protocol used for data transfer over the second network connection. Decoupling the two connections may make it possible to independently optimize data transfer requirements for the two channels e.g. optimizing the first connection for video processing on feedback versus optimizing the second connection for remote input commands.

According to one embodiment, the first communication protocol is a combination of a TCP/IP protocol and another protocol that is provided by a predefined remote desktop software, wherein the client-server configuration is defined by the remote desktop software. Combining multiple protocols for the preparation and transmission of data may enable better control and optimization of the transfer.

According to one embodiment, the first communication protocol involves a video codec optimized for a graphical user interface.

According to one embodiment, the second communication protocol is a TCP communication protocol or a UDP communication protocol. Using distinct protocols for the two connections may enable an independent control and optimization of data transfer.

According to one embodiment, the method further comprises converting control signals that are output from the hardware controller to data that can be transported using the TCP/IP protocol, wherein the transmitted control signals are the resulting converted control signals. This may enable a flexible and efficient system as a single converter may be used for multiple sources of control signals.

According to one embodiment, the hardware controller comprises a USB device and the conversion is performed using a USB converter.

According to one embodiment, the controlling of the detection apparatus is performed in response to receiving said output data from the local computer system. The present method may make use of the optimized data transfer over the first connection to control the imaging system efficiently based on output data. With slower connections this may not be possible as the imaging system needs to be controlled almost instantly.

According to one embodiment, said local computer system is operated as a local private network.

According to one embodiment, sending control signals comprises sending a first control signal and a subsequent, second control signal, and the method further comprises receiving an acknowledgement signal from the detection apparatus, the acknowledgement signal sent upon reception of the first control signal sent, whereby the subsequent, second control signal is sent regardless of the acknowledgement signal received. This may provide a flexible system that can efficiently control the imaging system, because waiting for acknowledgments that are usually always received may slow down the control process of the imaging system.

According to one embodiment, the hardware controller comprises a trackball hardware configured to remotely move a sample being imaged by the imaging system. The trackball hardware configured to convert trackball signals to TCP data. Output signals of a trackball are normally too fast to allow remote operation. Thus, the hardware controller may be configured to be able to move the sample taking into account the fast output signals. For example, additional controllers may be involved, whence the need to convert a multiplicity of source signals into TCP, such as using specific hardware (e.g. cable box). This embodiment may enable fast data transfer which may permit live (remote) operation and additional panels to be connected.

According to one embodiment, the detection apparatus is an electron microscope.

FIG. 1 depicts a cross section illustrating one example of a radiation detection apparatus or characterization tool 100 being a transmission electron microscope (TEM) for analyzing materials at the atomic and molecular levels. The detection apparatus 100 may comprise an imaging system configured for taking images of biological samples, polymers and nanoparticles.

The imaging system may for example comprise an irradiation system and an image forming system. The irradiation system may for example comprise an electron gun and condenser lenses. The image forming system may for example comprise objective and projector lenses and image shift deflectors. The electron gun may be configured to emit an electron beam. The electron beam is directed at a sample or specimen by the use of a predefined configuration of lenses. The imaging system 100 may further comprise a Gatan CCD camera for acquiring digital data.

The detection apparatus 100 is connected to a local computer system 103 via a direct USB connection 111. The local computer system 103 may display imaging data of the detection apparatus 100 on a controller window or a graphical user interface (GUI). The GUI may be used to facilitate instrument operation. The displayed image data may for example comprise transmitted bright or dark field images of 'n' stacked layers, with "n" being an integer equal or superior to one as well as their chemical analysis based on the collection of transmitted or reflected electrons.

Hardware controllers 105A-N may also be provided for controlling the operation of the detection apparatus 100. The detection apparatus 100 may connect to the hardware controllers via USB cables or connections 112. For example, the hardware controllers may comprise a trackball hardware 105A which is configured to move the sample being imaged by the detection apparatus 100. The trackball hardware may comprise a trackball that moves the sample or specimen in the direction in which the ball is turned and arrow switches for moving the sample in x and y directions. The hardware controllers may further comprise one or more control panels 105B-N. The control panels 105B-N may for example be used to align and select the condenser apertures and objective apertures, to focus the images, to shut down the detection apparatus in an emergency etc.

For example, the detection apparatus 100 and the local computer 103 and the hardware controllers 105A-N are located in a local site e.g. in a room. A radiation detection system may be provided, wherein the radiation detection system comprises at least one of the detection apparatus 100 and the local computer 103. The detection apparatus 100 and the local computer system 103 may be configured to operate in accordance with the present disclosure.

Figure 2:
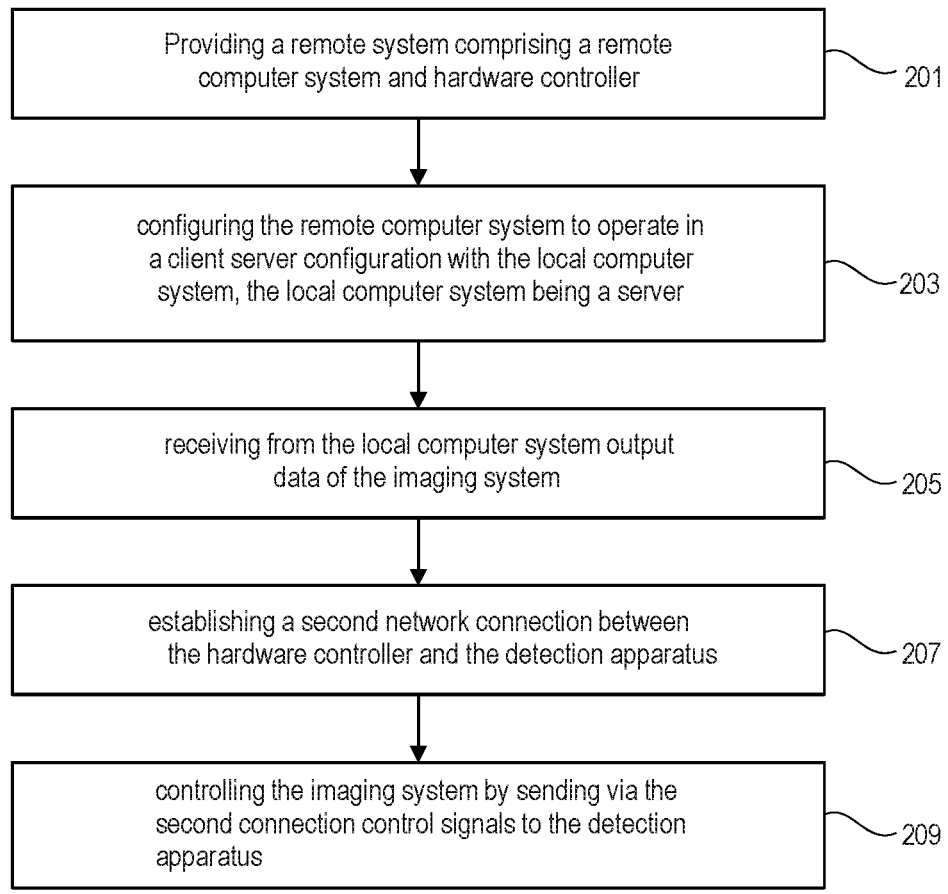
FIG. 2 is a flowchart of a method for a remote control of a detection apparatus in one embodiment.
Figure 3:
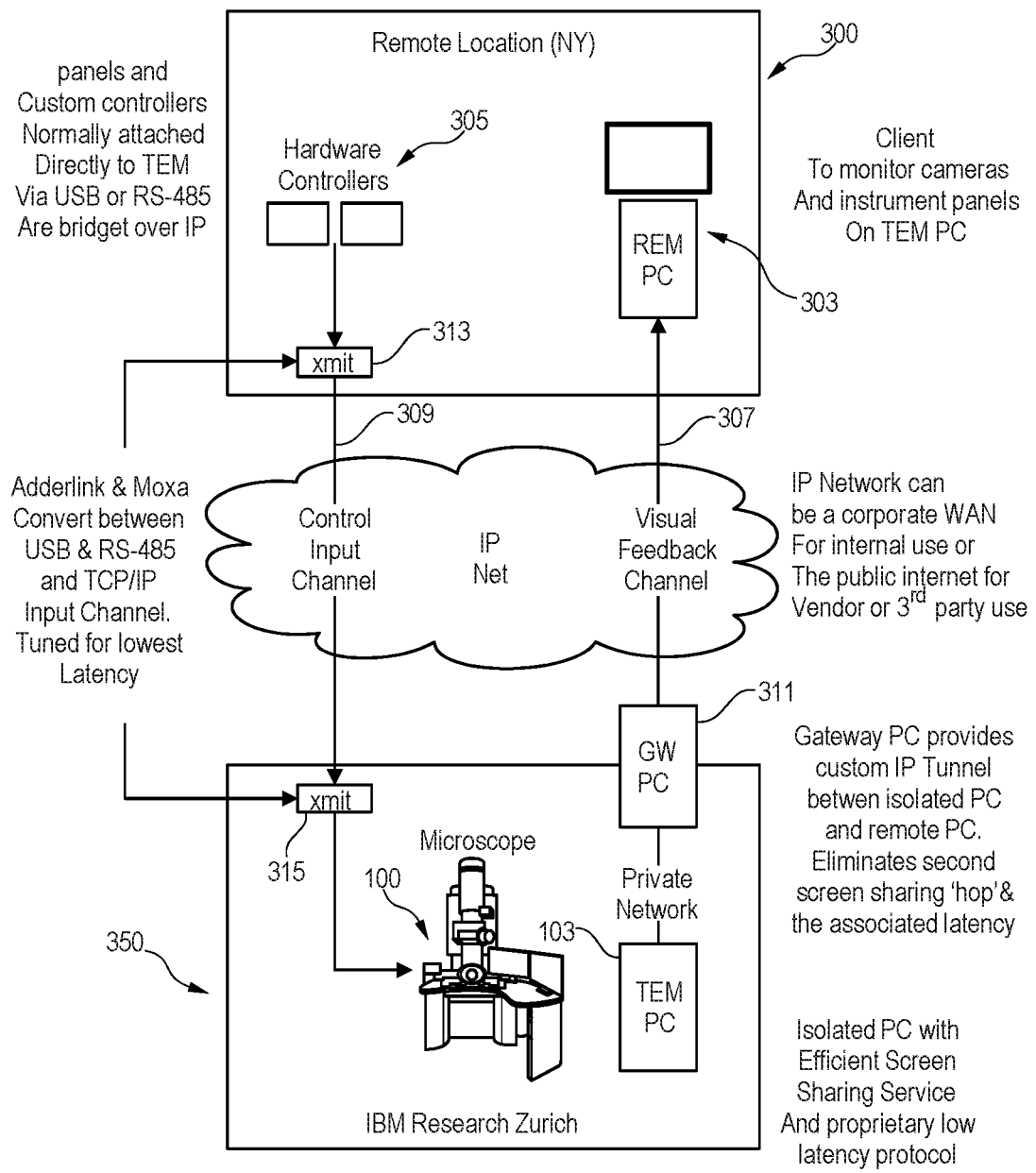
FIG. 3 depicts an example structure of a local and remote system in accordance with the present disclosure in one embodiment.

FIG. 2 is a flowchart of a method for a remote control of a radiation detection apparatus 100. FIG. 3 is used as an illustrative example for the description of the method.

In step 201, a remote system that comprises a remote computer system and at least one hardware controller may be provided. The remote system 300 is located in a location such that connections of the type of the connections 111-112, used for connecting hardware controllers 105A-N and computer system 103 to the detection apparatus 100, cannot be used to connect the remote system to the radiation detection system. An example of the remote system is shown in FIG. 3. The remote system 300 may for example be located in a remote site that is distant from the locale site e.g. the local site may be in Zurich and the remote site may be in New York. As shown in FIG. 3, the remote system 300 comprises the remote computer system 303 and at least one hardware controller 305. For example, the hardware controller 305 may be obtained by configuring or customizing the corresponding hardware controller 105A-N to operate remotely in accordance with the present method. This may be done by providing user interface means (UIM) that for example enables to convert data from a given format to another format that can be transmitted over the network and vice versa. A hardware controller may, for example, be connected with a connection, e.g. including an optical fiber, either to a similar hardware controller (e.g. for the TEM commands) or to a monitor where the same functionalities (e.g. inserting and retracting a detector, here the EDS) are converted into a digital signal and accessible from a touch screen panel.

In step 203, the remote computer system 303 may be configured to operate in a client-server configuration with the local computer system 103. For example, the local computer system 103 is a server and the remote computer system 303 is the client. For that, a remote desktop software may be used. The remote desktop software may enable a protocol that involves a video codec specifically designed for graphical user interfaces. The video codec exploits specific properties of GUI image data (e.g., large areas of same color, high contrasts, sharp edges, repeating patterns in the time and spatial domain). This way, one is able to obtain very high image quality and low response times for the user. More generally, any low-latency solution can be contemplated.

In step 205, the remote computer system 303 may receive from the local computer system 103 output data of the detection apparatus 100 over a first network connection 307 between the local computer system 103 and the remote computer system 303. The output data is received while the remote and local computer systems are in the client-server configuration. The first network connection may, in one example, be a connection between the remote system 300 and a radiation detection system 350. The radiation detection system 350 may comprise at least one of the detection apparatus 100 and the local computer system 103.

The preparation and transfer of data over the first network connection 307 is performed using a first communication protocol. The first communication protocol may for example be a combination of a TCP/IP protocol and the protocol that is provided by the predefined remote desktop software.

In one example, in case the local computer system 103 comprises more than one computer forming a private network, a computer bridge 311 may be provided such that the first network connection 307 may be performed via the bridge 311 between the remote computer system 300 and a computer of the private network.

In one example, the combination of protocols may further include a further protocol such as a TLS/SSL protocol. For example, a control logic may be invoked to launch a proxy application on the bridge 311 and establish, with the help of the proxy, a mutually-authenticated connection for encrypted end-to-end communications between the remote computer system 303 and the local computer system 103.

In step 207, a second network connection 309 may be established between the hardware controller 305 and the detection apparatus 100. The first network connection 307 and the second network connection 309 may physically and/or logically be independent. For example, the first and second network connections 307 and 309 may be logically independent in that the two connections are operated independently from each other, although they may be tunneled over a same IP infrastructure. The second network connection may, in one example, be a connection between the remote system 300 and the radiation detection system 350.

The transfer of data over the second network connection 309 may for example be performed using a second communication protocol. The second communication protocol may for example be distinct from the first communication protocol. For example, the second communication protocol may be a TCP/IP communication protocol or a UDP communication protocol. Decoupling the two connections may make it possible to independently optimize data transfer requirements for the two channels e.g. the video processing on feedback on the first connection versus remote input commands via the second connection.

In step 209, the detection apparatus 100 may be controlled by sending via the second network connection 309 control signals to the detection apparatus 100. The control signals of the hardware controller 305 may be converted by converter 313 which is part of the UIM. For example, in case the hardware controller 305 comprises a USB device, the UIM may comprise a USB converter for converting the signals output from the hardware controller to a format that can be transported over the second network connection 309. Another corresponding converter 315 may be used on the local site to convert back the data transmitted over the second network connection 309 to control signals that can control the detection apparatus 100 directly.

Figure 4:
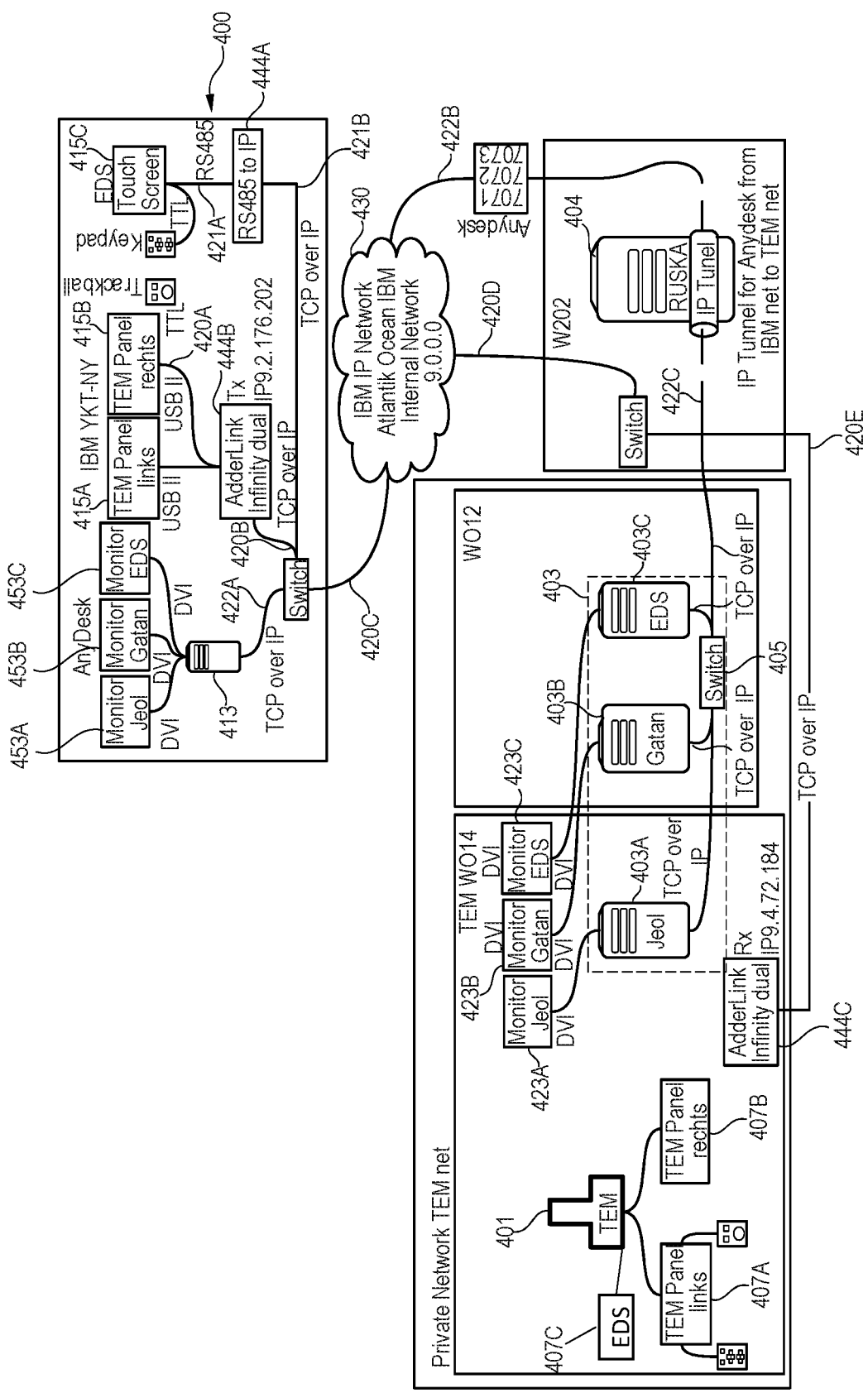
FIG. 4 depicts an example of a remote system for controlling a detection apparatus that is located in a local site in one embodiment.

FIG. 4 depicts an example of a remote system 400 for controlling a radiation detection apparatus or characterization tool 401 that is located in a local site. The detection apparatus 401 is controlled by a local computer system 403. The local computer system 403 forms a private network of computers 403A-C which are connected to a bridge computer 404 (e.g. "Ruska") via a switch 405. Each of the computers 403A-C may enable to perform a predefined monitoring or control of the detection apparatus 401. Each of the computers 403A-C is connected via dvi connectors to a respective display device 423A-C. Each of the display devices 423A-C may be used to perform a predefined analysis and/or monitoring and/or controlling operations. For example, display device 423A may enable to perform an analysis of transmitted bright field samples images, transmitted low and high angle annular dark field images, scanned transmitted bright and low or high angle annular dark field images, as well as enabling the characterization tool 401 operation. Display device 423B may enable to perform analysis of image data obtained by a CCD camera as well as chemical analyses from other detectors like one used for Electron Energy Loss Spectroscopy (EELS). Display device 423C may enable to perform energy dispersive x-ray spectroscopy (EDS) analysis of the sample. The detection apparatus 401 is connected to multiple local hardware controllers 407A-C.

The characterization tool 401 may require its own private network which may preserve the stability of the PCs involved, e.g., with respect to mandatory OS updates. This includes a number of computers 403A-C (or control PCs) controlling the tool 401 and the bridge 404. This private network 403 is interfaced with a network e.g. a user network 430 such as IBM IP network, via the bridge 404, which is located in premises of the user location where the tool 401 is installed. Such an architecture allows PCs 403A-C in the private network 403 to be maintained (e.g., by the supplier of the tool), at least partly independently from the maintenance policy of the network' user or owner.

The remote system 400 comprises a remote computer system 413 and remote hardware controllers 415A-C. The hardware controllers 415A-B may be communicating with the main hardware controllers 407 A-B through USB devices and hardware controller 415C may be communicating with the main EDS controller 407C through a RS485 device. The remote computer system 413 is connected to the detection apparatus 401 via a first network connection comprising the connection portions 422A, 420C, 422B and 422C over an IP network 430. The hardware controllers 415A-B are connected to the detection apparatus 401 via a second type network connection comprising the connection parts 420A, 420B, 420C, 420D and 420E. The hardware controllers 415C is connected to the detection apparatus 401 via a further second type network connection comprising the connection parts 421A, 421B, 420C, 420D and 420E.

User interface means (UIM) are provided remotely (e.g., in Yorktown, in addition to the local UIM in Zurich), which allow the tool 401 to be both locally and remotely operated. In order to achieve satisfactory latencies for remote operations (e.g., sufficiently fast refreshment rates of images sent back to the remote location), the first network connection may be a TCP connection that is established between the control PCs 403A-C (configured as servers) and the remote client PC 413 (which displays graphical feedbacks to the remote users). That is, a TCP connection is tunneled via the bridge 404 over IP, i.e., over the network of the user.

A low-latency protocol may be used for the first network connection. To that aim, a remote desktop software such as Anydesk software may be used, which relies on a low-latency proprietary protocol. This way, the TCP connection is tunneled via the bridge PC 404 over IP, using a protocol that involves a video codec specifically designed for graphical user interfaces. The video codec exploits specific properties of GUI image data (e.g., large areas of same color, high contrasts, sharp edges, repeating patterns in the time and spatial domain). This way, very high image quality and low response times for the user may be obtained. More generally, any low-latency solution can be contemplated. Other connection types could be contemplated, e.g., a TLS/SSL connection. That is, some control logic may be invoked to launch a proxy application on the bridge and establish, with the help of the proxy, a mutually-authenticated connection for encrypted end-to-end communications between the remote display PCs and server (local) PCs.

The bridge 404 is used to interface the network 430 and the private network 403. This bridge 404 establishes a TCP tunnel bridging the "Anydesk" traffic from the private network to the remote IBM traffic (e.g., Yorktown), so as to achieve satisfactory refreshment rates. E.g., users may get almost instantaneous feedbacks (in less than 200 ms) when remotely operating the samples and the tool 401. The tool 401 may require multiple remote desktop screens 453A-C similar to display devices 423A-C (e.g., TEM control, EDS [analysis, control], Gatan [image acquisition, control]), whence the need to configure the several local counterpart PCs as server.

A similar gateway server (remote bridge) like "Ruska" may be built to tunnel the traffic to the private TEM network from the public internet rather than the corporate network. This gateway is protected on the internet by a secure VPN interface. This would allow remote operation for trusted external third parties.

Meanwhile, inputs from the remote hardware controllers 415A-C use another channel or connection, which is also routed over IP. Decoupling the two channels makes it possible to independently optimize data transfer requirements for the two channels (video processing on feedback versus remote input commands). For example, operating the tool 401 requires specific USB control panels. For the remote USB control panels, converters 444A-B (e.g. from Adderlink) may be used to convert USB to TCP and RS485 to TCP. Additional converters 444C (e.g. from Adderlink) may be used locally in Zurich (ZRL) to convert TCP back to USB. With the present system, the data may cross the Atlantic with a round trip time of around 100-150 ms which is low enough so as not to be noticeable by the remote operator. Moreover, because of the multiple (local and remote) controls (e.g., JEOL panels), a USB A/B switch to switch between the local set of panels in ZRL and the remote set of panels in New York (YKT) may be used. This may enable to control the remote availability of the detection apparatus 401 e.g. no one in the remote place may use the tool 401 without permission.

The converters e.g. 444A or the controllers e.g. 415C may be configured to include a component that is configured to tolerate longer latencies in the feedback received by the hardware controllers 415C, e.g., larger than 50, 100 or larger than 150 ms. That is, the controllers 415C may be modified to tolerate latencies adjusted for the desired remote operation. This way, the remote users can effectively send input commands (relating to the sample operation or room conditions for example), via the second network connection notwithstanding the non-standard latency time for the acknowledgement signals. The protocol used may optionally be optimized for this input channel.

The hardware controller 415C may include a trackball, whose output signals are normally too fast to allow remote operation. Thus, the hardware controller 415C may be configured to be able to move the sample taking into account the fast output signals. For example, additional controllers may be involved, whence the need to convert a multiplicity of source signals into TCP, such as using specific hardware (e.g. cable box).

More generally, the present method may be applied to various types of radiation detection apparatuses (and corresponding control systems), i.e., characterization tools configured for detecting particles (e.g., electrons), or photons (e.g., gamma rays or x-rays). Such apparatuses will typically include semiconductor detectors to measure an incident radiation, for example to sense electromagnetic radiation (e.g., optical photons, x-rays or gamma-rays), or particle radiation (e.g., alpha particles or electrons). That is, such radiation detectors typically involve semiconductor-based detection devices, designed to sense electromagnetic or particle radiation. Of particular interest are apparatuses intended for x-ray imaging, x-ray diffraction, x-ray spectroscopy, or apparatuses comprising detectors designed to sense charged particles such as electrons, positrons, protons, and ions, as well as particles arising from nuclear decays (e.g., alpha or beta particles). In all cases, such detectors are preferably embodied as imaging detectors, to enable an imaging system, as in embodiments.

Various embodiments are specified in the following numbered clauses.

1. A method for remotely controlling a radiation detection apparatus comprising an imaging system, wherein the detection apparatus is locally connected to a local computer system and is remotely controllable by a hardware controller, the method comprising:

providing a remote control system comprising a remote computer system and the hardware controller;

configuring the remote computer system for it to operate in a client-server configuration with the local computer system, wherein the latter is configured as a server; and receiving from the local computer system output data of the imaging system over a first network connection established between the local computer system and the remote computer system in said client-server configuration, and controlling the detection apparatus by sending control signals to the detection apparatus via a second network connection established between the hardware controller and the detection apparatus, the second network connection being logically independent from the first network connection.

2. The method of clause 1, wherein data transferred over the first network connection is transferred using a first communication protocol distinct from a second communication protocol used for transferring data over the second network connection.

3. The method of any of the preceding clauses, wherein the first communication protocol is a combination of a TCP/IP protocol and another protocol that is provided by a predefined remote desktop software, wherein the client-server configuration is defined by the remote desktop software.

4. The method of any of the preceding clauses 2-3, wherein the first communication protocol involves a video codec optimized for a graphical user interface.

5. The method of any of the preceding clauses 2-4, the second communication protocol being a TCP communication protocol or a UDP communication protocol.

6. The method of clause 5, further comprising converting control signals that are output from the hardware controller to data that can be transported using the TCP/IP protocol, wherein the transmitted control signals are the converted control signals.

7. The method of clause 6, wherein the hardware controller comprises a USB device and the conversion is performed using a USB converter.

8. The method of any of the preceding clauses, wherein controlling the detection apparatus is performed in response to receiving said output data from the local computer system.

9. The method of any of the preceding clauses, wherein said local computer system is operated as a local private network.

10. The method of any of the preceding clauses, wherein sending control signals comprises sending a first control signal and a subsequent, second control signal, and the method further comprises receiving an acknowledgement signal from the detection apparatus, the acknowledgement signal sent upon reception of the first control signal sent, whereby the subsequent, second control signal is sent regardless of the acknowledgement signal received.

11. The method of any of the preceding clauses, wherein the hardware controller comprises a trackball hardware configured to remotely move a sample being imaged by the imaging system, the trackball hardware configured to convert trackball signals to TCP data, wherein the trackball signals are generated at a predefined frequency.

12. The method of any of the preceding clauses, wherein the detection apparatus is an electron microscope.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of remotely controlling a radiation detection apparatus comprising an imaging system, wherein the detection apparatus is locally connected to a local computer system and is remotely controllable by a hardware controller, the method comprising:
   providing a remote control system, the remote control system comprising at least a remote computer system and the hardware controller;
   configuring the remote computer system for the remote computer system to operate in a client-server configuration with the local computer system, wherein the local computer system is configured as a server;
   receiving from the local computer system output data of the imaging system over a first network connection established between the local computer system and the remote computer system in said client-server configuration; and
   controlling the detection apparatus by sending control signals from the remote control system to the detection apparatus via a second network connection established between the hardware controller of the remote control system and the detection apparatus, the second network connection being logically independent from the first network connection, the hardware controller of the remote control system configured to remotely move a sample being imaged by the imaging system via the second network connection.

2. The method of claim 1, wherein data transferred over the first network connection is transferred using a first communication protocol distinct from a second communication protocol used for transferring data over the second network connection.

3. The method of claim 2, wherein the first communication protocol is a combination of a TCP/IP protocol and another protocol that is provided by a predefined remote desktop software, wherein the client-server configuration is defined by the remote desktop software.

4. The method of claim 2, wherein the first communication protocol involves a video codec optimized for a graphical user interface.

5. The method of claim 2, the second communication protocol being a TCP communication protocol or a UDP communication protocol.

6. The method of claim 4, further comprising converting control signals that are output from the hardware controller to data that can be transported using the TCP/IP protocol, wherein the transmitted control signals are the converted control signals.

7. The method of claim 6, wherein the hardware controller comprises a USB device and the conversion is performed using a USB converter.

8. The method of claim 1, wherein controlling the detection apparatus is performed in response to receiving said output data from the local computer system.

9. The method of claim 1, wherein said local computer system is operated as a local private network.

10. The method of claim 1, wherein sending control signals comprises sending a first control signal and a subsequent, second control signal, and the method further comprises receiving an acknowledgement signal from the detection apparatus, the acknowledgement signal sent upon reception of the first control signal sent, whereby the subsequent, second control signal is sent regardless of the acknowledgement signal received.

11. The method of claim 1, wherein the hardware controller comprises a trackball hardware configured to remotely move a sample being imaged by the imaging system, the trackball hardware configured to convert trackball signals to TCP data.

12. The method of claim 1, wherein the detection apparatus is an electron microscope.

13. A control system comprising a hardware controller for remotely controlling a radiation detection apparatus locally connected to a local computer system, the detection apparatus including an imaging system, wherein the control system is configured to:
- operate in a client-server configuration with the local computer system, the latter configured as a server;
- receive from the local computer system output data of the imaging system over a first network connection established between the local computer system and the control system in said client-server configuration, in operation; and
- control the detection apparatus by sending control signals thereto, via a second network connection established between the hardware controller of the control system and the detection apparatus locally connected to the local computer system, in operation, the second network connection being logically independent from the first network connection, the hardware controller of the remote control system configured to remotely move a sample being imaged by the imaging system via the second network connection.

14. The system of claim 13, wherein the hardware controller comprises a trackball configured so as to remotely move a sample placed in the detection apparatus, by sending said control signals to the detection apparatus, in operation.

15. A radiation detection system for controlling a radiation detection apparatus comprising an imaging system, wherein the radiation detection system comprises a local computer system locally connected to the detection apparatus, the radiation detection system configured to:
- operate in a client-server configuration with a remote control system, the remote control system comprising at least a remote computer system and a hardware controller, the local computer system configured as a server;
- establish a first network connection between the local computer system and the remote computer system in said client-server configuration, and a second network connection between the hardware controller of the remote control system and the detection apparatus, wherein the second network connection is logically independent from the first network connection, in operation, so as for the remote control system to receive from the local computer system output data of the imaging system over the first network connection, and the remote control system to control the detection apparatus by sending control signals to the detection apparatus via the second network connection, in operation, the hardware controller of the remote control system configured to remotely move a sample being imaged by the imaging system via the second network connection.

16. The radiation detection system according to claim 15, wherein the radiation detection apparatus is an electron microscope.

17. The radiation detection system according to claim 15, wherein the radiation detection apparatus is a transmission electron microscope.

* * * * *